United States Patent [19]

Kalokitis

[11] Patent Number: 4,641,107

[45] Date of Patent: Feb. 3, 1987

[54] PRINTED CIRCUIT RADIAL POWER COMBINER WITH MODE SUPPRESSING RESISTORS FIRED AT HIGH TEMPERATURE

[75] Inventor: David Kalokitis, Mercer County, N.J.

[73] Assignee: RCA Corporation, Princeton, N.J.

[21] Appl. No.: 736,346

[22] Filed: May 21, 1985

[51] Int. Cl.$^4$ .................. H03F 3/60; H01P 5/12
[52] U.S. Cl. ...................... 330/286; 29/592 R; 330/295; 333/128; 333/136; 333/246; 333/251
[58] Field of Search ................ 330/53, 286, 287, 295; 333/127, 128, 130, 136, 246, 251; 29/592 R, 610 R, 620, 829

[56] References Cited

U.S. PATENT DOCUMENTS

| | | | |
|---|---|---|---|
| 3,733,560 | 5/1973 | Oltman, Jr. et al. | 330/56 |
| 3,783,401 | 1/1974 | Oltman, Jr. | 330/56 |
| 3,873,934 | 3/1975 | Oltman, Jr. et al. | 330/56 |
| 3,873,935 | 3/1975 | Oltman, Jr. | 330/56 |
| 3,958,247 | 5/1976 | Bogner et al. | 343/754 |
| 4,263,568 | 4/1981 | Nemit | 333/127 |
| 4,282,491 | 8/1981 | MacMaster et al. | 330/286 |
| 4,291,278 | 9/1981 | Quine | 330/286 |
| 4,371,845 | 2/1983 | Pitzalis, Jr. | 333/128 X |
| 4,424,496 | 1/1984 | Nichols et al. | 330/286 |

OTHER PUBLICATIONS

Article entitled "Microwave Power Combining Techniques", by: Kenneth Russell, published in IEEE Transactions on Microwave Theory & Techniques, vol. MTT-27, No. 5, May 1979, pp. 472–478.
Article entitled "A Wideband Radial Power Combiner for FET Amplifiers", by: Schellenberg et al., published in the 1978 IEEE International Solid-State Circuits Digest of Technical Papers, pp. 164-165.
Article entitled "A 10 Watt Broadband FEI Combiner/Amplifier", by Cohn et al., pp. 292-297, MTT-S Symposium Digest, 1979, Orlando, Florida.
Article entitled "An 18 GHZ 8-Way Radial Combiner", by: I. Stones et al., published in the 1983 IEEE MTT-S Digest, pp. 163-165.
Article entitled "Radial Combiner Runs Circles Around Hybrids", by: B. J. Sanders, published in Microwaves Magazine, Nov. 1980, pp. 55-58.
Article entitled "A 6-GHZ 80-W GaAs FET Amplifier with TM-Mode Cavity Power Combiner", by: Okubo et al., published in 1983, IEEE MTT-S Digest, pp. 276-278.
Article entitled "60-Way Radial Combiner Uses No Isolators", by: Stephen J. Foti et al.

Primary Examiner—James B. Mullins
Attorney, Agent, or Firm—Joseph S. Tripoli; Robert L. Troike; William H. Meise

[57] ABSTRACT

A power splitter/combiner includes a radial waveguide and a coaxial common port coupled to the center of the radial waveguide. The radial waveguide has a plurality of transmission lines around its periphery at equally spaced locations. Because of its symmetry, the power at each of the peripheral transmission lines is related to the power at the common port in proportion to the number of peripheral transmission lines. For operation at high frequencies, the radial waveguide, the transmission lines and the transition from radial waveguide to the transmission lines have their structural details defined by a printed circuit (PC) board having a low temperature dielectric material. The PC board includes a plurality of radial slots to control undesired circumferential modes. A resistance arrangement is coupled across the open end of each radial slot to dissipate circumferential power. The resistance arrangement includes a copper ring including a like number of radial slots, and at least one thick-film resistor fired at high temperature onto the ring near the open end of each radial slot. A bond wire couples each thick film resistance arrangement across its associated slot. The ring with fired-on resistors is bonded at low temperature onto the printed circuit board with radial slots in the ring registered with the radial slots on the printed circuit board.

15 Claims, 16 Drawing Figures

PRINTED CIRCUIT RADIAL POWER COMBINER WITH MODE SUPPRESSING RESISTORS FIRED AT HIGH TEMPERATURE

BACKGROUND OF THE INVENTION

This invention relates to a radical power combiner for microwave signals and more particularly to resistors for suppressing undesired modes, which resistors are made from inks fired at high temperatures in order to provide good thermal bonds to their heat sinks.

Communications systems are making increasing use of Earth satellites as transponders. The use of satellites for communication links between cities eliminates the need for land communication cables, which are very costly. In order to provide continuous coverage, a satellite must be in a geosynchronous orbit. Such orbits require that the satellite be at an altitude of about 22,000 miles. Thus, communications by way of a geosynchronous satellite requires transmission over a path length of 22,000 miles to the satellite and transmission from the satellite over a 22,000 mile path length to the receiving Earth station. Transmission over such a distance requires relatively high antenna gain. The necessary gain is achievable with antennas of reasonable size and reasonable cost only at microwave frequencies and frequencies higher than microwave.

The transmission of signal from the satellite to the Earth station requires a power amplifier located in the satellite capable of generating tens or hundreds of watts of microwave power with great reliability. In the past, the microwave power was generated by travelling wave tubes (TWT). Travelling wave tubes were, and continue to be, used for satellite transmitters notwithstanding the reliability problem attributable to the inherent degregation resulting from operation over a period of time. More recently, solid state power amplifiers (SSPA) have been used at lower microwave frequencies, such as at C-band instead of travelling wave tubes. The SSPA has no inherent degradation mechanism so is more reliable than the TWT. A need exists to provide solid state power amplifiers at X-band (around 10 GHz) and at millimeter wave frequencies.

Solid state power amplifiers are implemented by using a large number of relatively low power solid state devices. Each solid state device provides a small portion of the total output power, and power combiners are used to combine the powers from each of the individual solid state devices to generate the desired amount of signal power at microwave or millimeter wave frequencies.

Various types of power combiners are described in the article "Microwave Power Combining Techniques" by Kenneth J. Russell, published in the IEEE Transaction Microwave Theory and Techniques, May 1979. In the Russell article, corporate or tree combiners are described as being useful for combining a small number of devices but as being very inefficient as the number of devices combined increases. Similarly, the chain type of combiner is not useful. Russell also describes resonant and nonresonant N-way combiners. Among the more successful techniques for combining power which he describes are the cavity combining technique. However, this technique has limited bandwidth. It is desirable to have a broad bandwidth in a satellite transmission channel in order to maximize the usefulness of the expensive satellites.

U.S. Pat. No. 4,291,278 issued Dec. 22, 1981, to Quine describes a power amplifier including a feed waveguide, a fin-line array transition from waveguide to microstrip, a plurality of amplifiers each of which is fed from microstrip, a plurality of phase shifters at the output of the amplifiers for compensating phase, and a fin-line array transition from microstrip to waveguide. This structure requires a phase compensator for each amplifier in order to compensate for the different path lengths from the common feed point to each amplifier, and therefore has the additional problem of requiring alignment of the phase compensators. Furthermore, each phase compensator presumably has a different loss and this results in combination of unequal powers. As the number of amplifiers increases from a few to a very large number, the linear dimensions of the Quine amplifier increase proportionally and it can be very large. Also, the length of the transmission lines to and from the amplifier most remote from the feed point tends to reduce the effectiveness of the structure in combining the power.

A power amplifier is desired which is easy to manufacture and suitable for use at microwave and millimeter wave frequencies, which has relatively small linear dimensions when large numbers of amplifier modules are used, in which each amplifier module is provided with positive heat sinking, and each module can be accessed for maintenance without substantial disassembly of the structure.

U.S. Pat. No. 4,263,568 issued Apr. 21, 1981, to Nemit describes a radial power splitter/combiner which provides low loss N-way power splitting and/or combining. The Nemit structure includes a radial parallel plate waveguide which is coupled at its center to a coaxial common port. At the periphery of the radial parallel plate waveguide, a number of wedge-shaped loops sample the energy. Because of the symmetry of the structure, each loop receives an equal amount of the energy from the common port in splitter or divider operation. When used as a combiner, application of equal energies to the N ports causes their sum to appear at the common port, less any losses. Unavoidable asymmetry due to construction tolerances causes unequal power to appear at each of the N ports when operated as a splitter. These asymmetries, or inequality of the powers applied to the N ports when operated as a combiner, may lead to an undesirable operating mode in which energy flows around the periphery of the structure. This mode may cause high VSWR, excess insertion loss and/or phase shifts. In order to reduce such undesirable effects, the symmetry of the structure should be as good as possible, and when operated as a power combiner, the signals applied to the N ports should be applied in equal amplitude from sources having equal source impedances. Any residual circulating energy may be attenuated by resistors coupled across the slots between coupling loops.

At frequencies in the microwave and millimeter-wave regions, it is difficult to make a completely symmetrical N-way divider or combiner where N is large, because of the small physical size of the details of the structure. For this reason, it is very advantageous to draw the circuit in a large size so that the symmetry and circuit details can be clearly defined, photographically reduce the drawing and reproduce it as a printed circuit board. The resulting printed circuit board does not depend on the skill of a machinist for symmetry and fine detail.

The printed circuit board is formed from an organic material having a low dielectric constant and low loss in order to allow a practical printed circuit board thickness and transmission line width. Chip resistors can be soldered to the printed circuit metalization. This is a laborious procedure which must be performed by skilled personnel, and is subject to inadvertent errors such as solder bridges located beneath the chip resistors which short-circuit across the gaps but are invisible to the eye. These short-circuits are especially difficult to locate with direct-current instruments such as multimeters since the gap is intentionally short-circuited at the end. Chip resistors soldered to the printed circuit metallization and coupled across slots formed in the metallization performed satisfactorily in a power dividing mode. When used as a power combiner to combine the power from 30 solid state amplifier modules, however, some of the resistors were destroyed by the application of power.

It would be desirable to have an arrangement for suppressing undesirable circulating modes in a radial power splitter/combiner which is easily fabricated, and rugged.

SUMMARY OF THE INVENTION

A radial power splitter/combiner includes a radial transmission line formed from a printed circuit board on an organic base. The printed circuit board defines radial slots which act as chokes to attenuate undesirable circular operating modes. The undesired circular mode signals are attenuated by resistors coupled across the slots. When high power is being handled, the resistors absorb power and dissipate heat. In order to provide a good thermal bond between each resistor and its heat sink, each resistor is made as an ink fired at high temperature onto its heat sink. If the heat sink is the printed circuit board, the high resistor firing temperature destroys the organic base of the board. In order to fire the resistors to the heat sink without destroying the printed circuit board, the resistors are fired onto a formed metal ring. In order to define fine structural details of the splitter/combiner by the printed circuit board and not by the ring, the metal ring is bonded at low temperature to the printed circuit board.

DETAILED DESCRIPTION OF THE INVENTION

Figure 1:
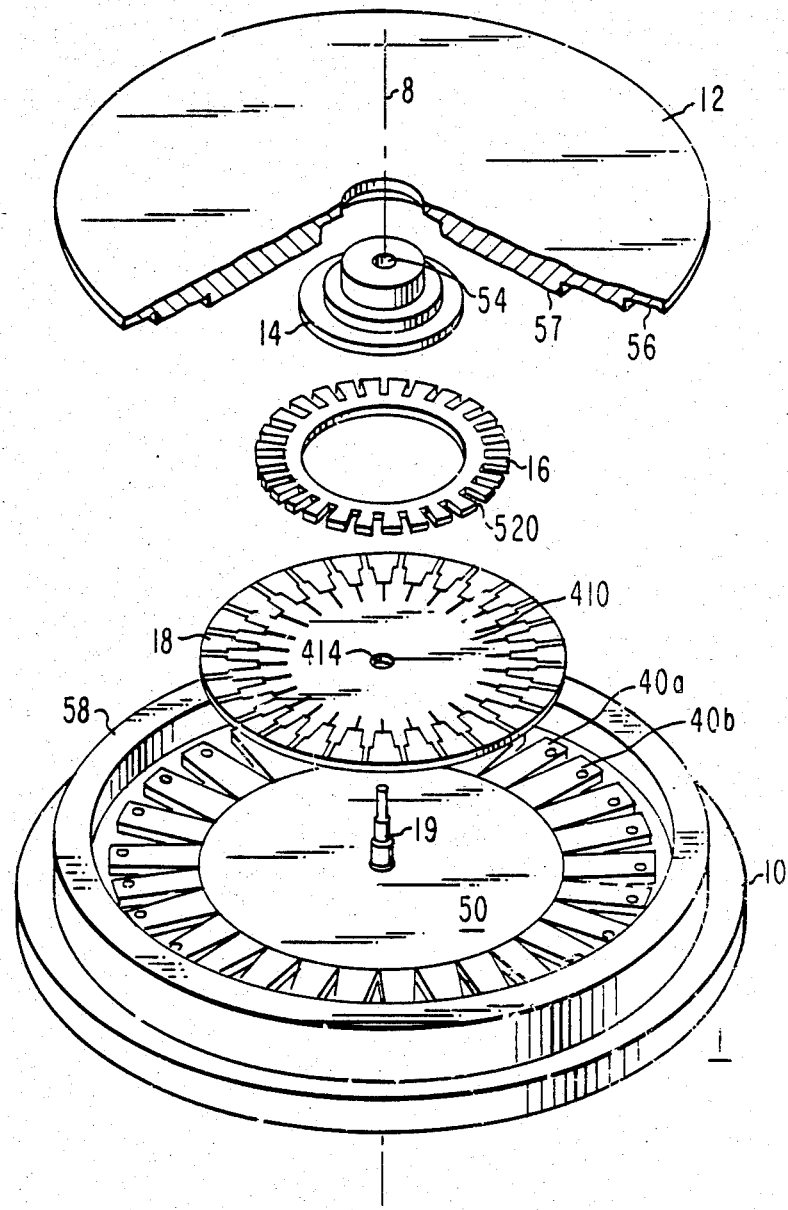
FIG. 1 is a simplified exploded view of the top portion of an amplifier according to the invention.
Figure 2:
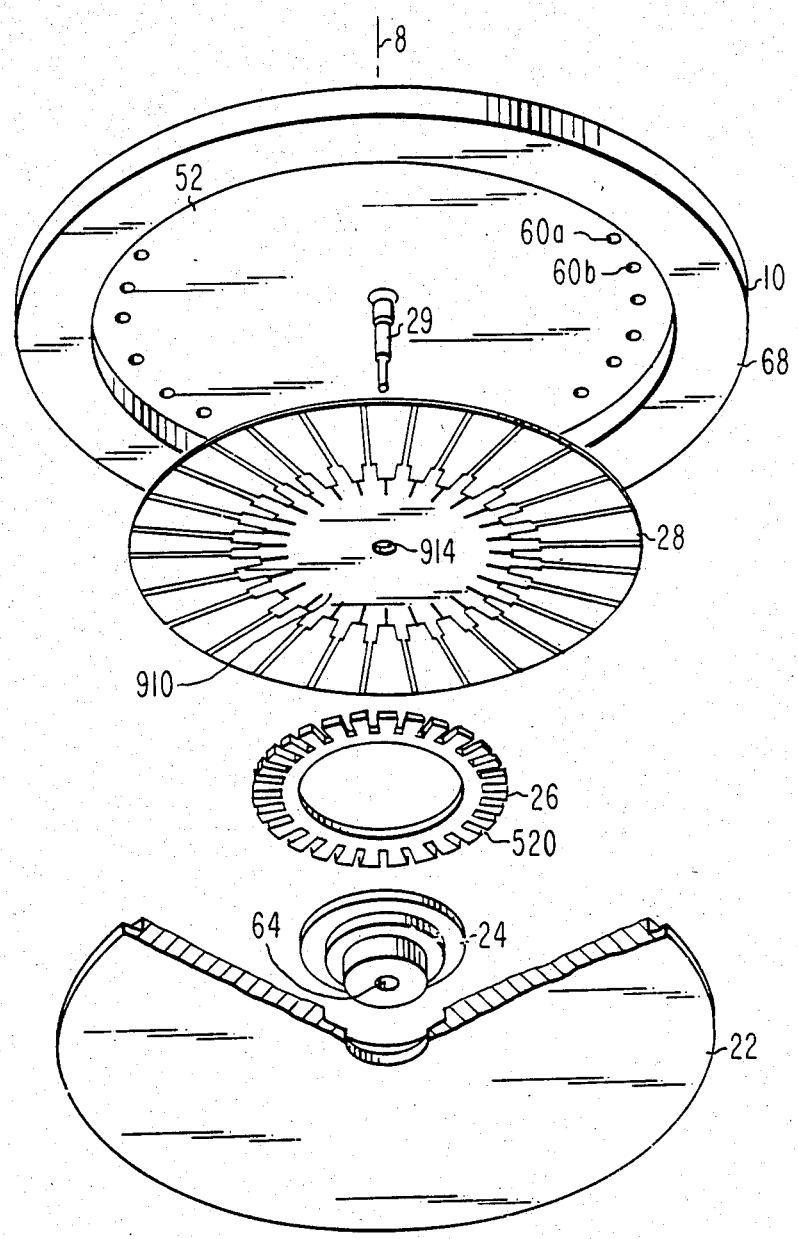
FIG. 2 is a simplified exploded view of the bottom portion of an amplifier according to the invention.
Figure 3A:
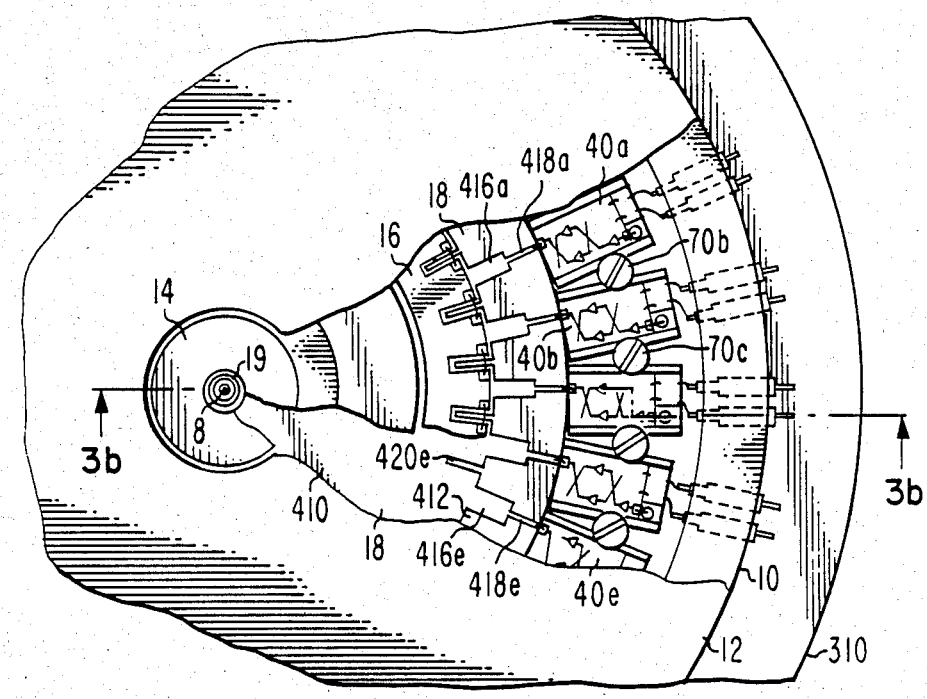
FIG. 3a is a plan view, partially cut away, of a portion of the amplifier illustrated in FIGS. 1 and 2.
Figure 3B:
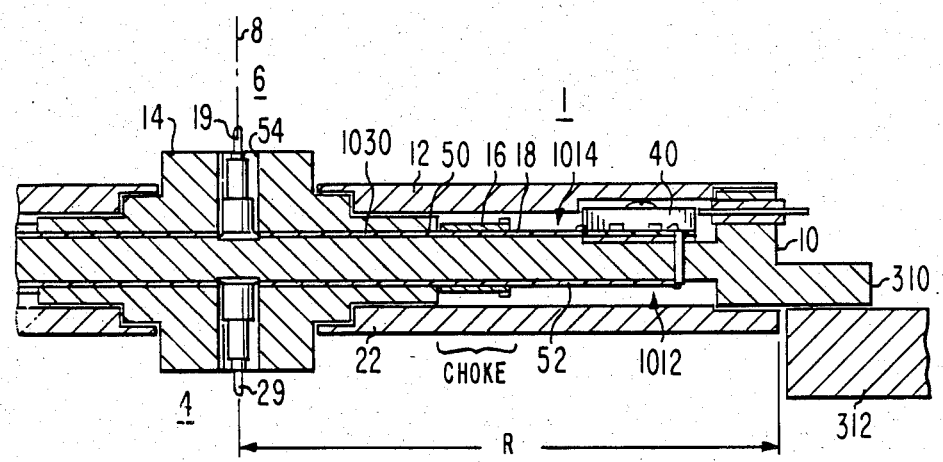
FIG. 3b is an elevation view of a cross-section of the arrangement of FIG. 3a taken along lines b—b.

FIG. 1 is an exploded view of the top half of a radial power amplifier 1 according to the invention, and FIG. 2 is an exploded bottom view. FIG. 3a is an elevation view of a portion of the structure of amplifier 1, partially cut away to show the interior, and FIG. 3b is an elevation view of a section of the portion illustrated in FIG. 3a. In FIGS. 1–3, a generally disc-shaped conductive central member 10 includes flat disc-like portion 50 and a corresponding bottom disc-like portion 52 centered on an axis 8. A conductive center pin 19 of a coaxial output port 6 is coupled to the center of disc-like portion 50 of center member 10. A printed circuit board 18 having a copper pattern 410 etched on its upper surface is mounted on disc-like surface 50 with pin 19 protruding through central aperture 414. Details of printed-circuit board 18 are described in conjunction in FIG. 4. A copper ring 16 is mounted atop printed circuit board 18. Ring 16 has radial slots, one of which is designated 520 in FIG. 1, extending radially inward from the outer periphery of the ring. Slots 520 of ring 16 are aligned with printed circuit pattern 410 as described below. Ring 16 is maintained centered on axis 8 by a conductive stepped flange 14. The steps of flange 14 provide surfaces for mounting a conductive cover 12 by means of screws (not shown), and a central aperture 54 of flange 14 forms the outer conductor of coaxial output port 6 of the amplifier. The lower portion of top cover 12 includes a conductive stepped portion 56 machined to mate with a circumferential flange 58 formed integrally with central member 10. When assembled, lower surface 57 of cover 12 is held firmly against conductive pattern 410 on the top of printed circuit board 18. A plurality of amplifier modules 40a, 40b, 40c . . . is arranged in circumferential fashion between surface 50 and flange 58, with the input end of each amplifier module nearest flange 58 and the output end adjacent to surface 50.

The bottom half of the amplifier structure is generally similar to the upper half. Referring to FIG. 2, central member 10 includes a lower disc-like surface 52 and a center conductor pin 29 of an input port designated generally as 4 extending from the center thereof. A circumferential flange 68 which is an integral portion of central member 10 provides a surface for mounting a conductive bottom cover 22 by means of screws (not shown). A printed circuit board 28 having a copper pattern 910 etched onto the lower side thereof is mounted against surface 52 with center conductor pin 29 of input port 4 protruding through central aperture 914. Details of the pattern on board 28 are illustrated in conjunction with FIG. 9. It should be noted that printed circuit board 28 is larger in diameter than printed circuit board 18. The edge of printed circuit board 28 when mounted on surface 52 is adjacent the centers of through holes 60. Holes 60 are parallel to axis 8 and traverse through member 10 from surface 52 to surface 50. These holes form the outer conductors of coaxial transmission lines designated 708, as illustrated in conjunction with FIGS. 3b and 7. A copper heat sinking disk 26 identical with disc 16 is mounted on the lower surface of printed circuit board 28 with its radial slots 520 aligned with the printed pattern of board 28. The uppermost step of a conductive stepped flange 24 fits within the inner diameter of ring 26 and holds it in a centered position. Central aperture 64 of flange 24 forms the outer conductor of input port 4 of the amplifier structure. Another step of flange 24 provides a seat for bottom cover 22. Central member 10 includes a circumferential flange portion designated 310 in FIG. 3 to which a thermally conductive heat sinking structure 312 may be thermally fastened as illustrated in FIG. 3b.

Figure 4:
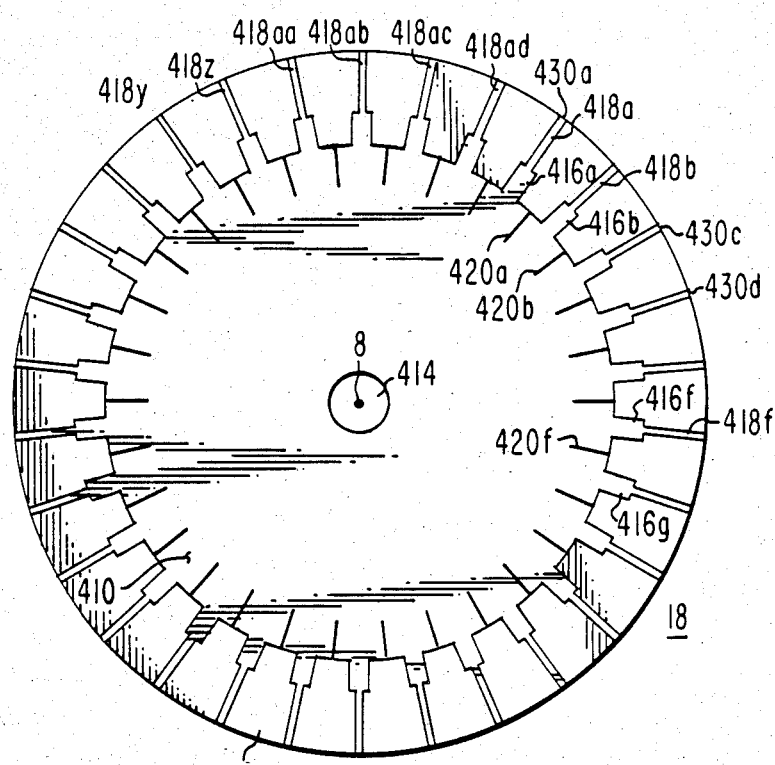
FIG. 4 illustrates the pattern of a printed circuit board which is a portion of the arrangement illustrated in FIGS. 1 and 3.

FIG. 4 illustrates details of printed circuit board 18. Printed circuit board 18 has a copper pattern 410 formed on one side of a circular disc 412 of dielectric material by a process such a photolithography and etching. Board 18 has a central aperture 414 and is circularly symmetrical with respect to axis 8. A conductive pattern defined by region 410 includes a conductive region extending from the periphery of central aperture 414 to the inner edges of peripheral radial slots 420, and includes wide conductive regions 416 and narrow conductive regions 418 extending from the periphery of conductive region 410 to the edge of board 18. There are 30 conductive regions 418, one for each amplifier module.

Figure 10:
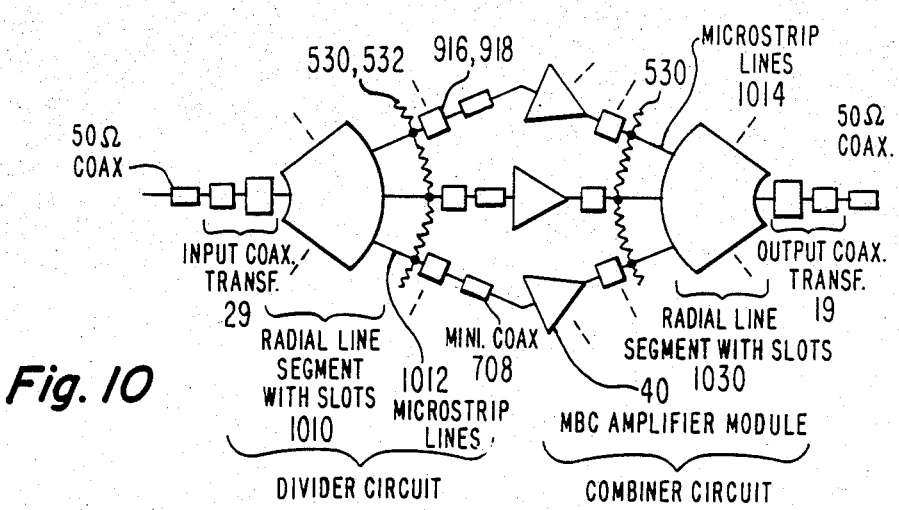
FIG. 10 is a schematic diagram of the arrangement illustrated in FIGS. 1 and 3.

Printed circuit board 18 when mounted on upper surface 50 of central member 10 forms a radial transmission line or waveguide 1030 lying between surface 50 and conductive region 410. Radial transmission line 1030 extends radially away from output port 6. The elongated portions 416 and 418 coacting with surface 50 form microstrip transmission lines designated generally as 1014 in FIG. 10.

The end of each narrow conducting region 418 remote from axis 8 defines a microstrip terminal or port when printed circuit board 18 is mounted on surface 50. The terminals are designated 430a, 430b . . . in FIG. 4. There are 30 microstrip terminals associated with printed circuit board 18.

Excellent symmetry can be achieved between the radial transmission line and the 30 microstrip lines, because the entire structure is defined by the conductive pattern formed on the printed circuit board. A structure intended for operation at 10 GHz and above has structural details of small size. These details can be drawn in large scale and photographically reduced in size to form a master pattern, which is then transferred by photolithography to form the metal pattern on the printed circuit board.

The dielectric material of board 18 is selected for satisfactory propagation at the frequency of interest. For an embodiment of the invention intended for operation in the region of 8 to 14 GHz, the printed circuit board has a glass microfiber reinforced polytetrafluoroethylene composite dielectric material known as RT/Duroid manufactured by Rogers Corporation. The dielectric constant of the material is 2.2.

Figure 7:
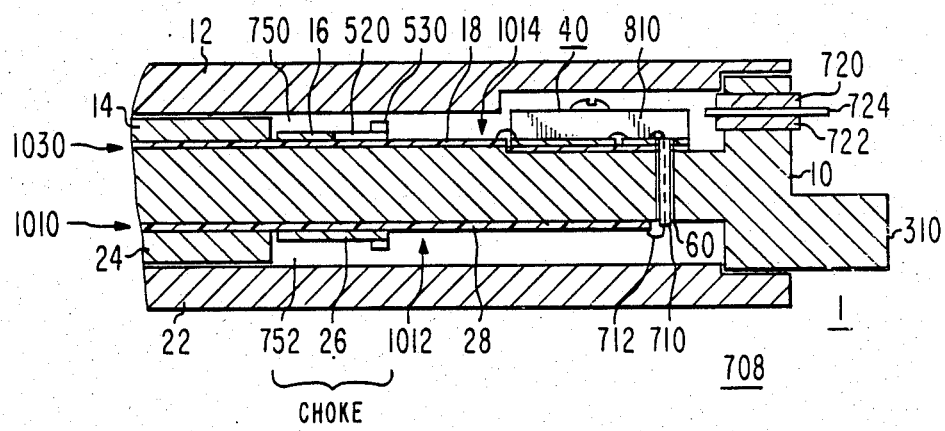
FIG. 7 is an elevation view of a cross-section of a portion of the amplifier of FIGS. 1 and 3 illustrating details of an axially oriented coaxial transmission line and its location relative to an amplifier module.

A radial choke designated as 750 in FIG. 7 has a lower wall formed by the top surface of ring 16 and a top wall formed by that portion of the lower surface of top cover 12 facing ring 16. A portion of stepped flange 14 sandwiched between cover 12 and printed circuit board 18 short-circuits the end of radial choke 750. Choke 750 aids in the transition of signal between radial transmission line 1030 and microstrip transmission line 1014. A corresponding choke 752 is formed on the lower portion of amplifier 1 by facing surfaces of ring 26 and bottom cover 22 in conjunction with a portion of flange 24.

Radial slots 420 in the conductive pattern of printed circuit board 18 have a length of one quarter wavelength at the center of the frequency of interest, which is 12 GHZ for the above-mentioned embodiment. Slots 420 insure isolation between the microstrip ports 430. Under conditions of perfect symmetry, in which all amplifier modules provide identical performance and each amplifier is driven with equal signal energy, the fields on each side of each slot will be identical, so no field component exists tending to cause a signal current flow across any slot. It is desirable to dissipate the signal energy represented by currents tending to flow across the slots, and thereby tend to restore symmetry and prevent circulation of signal energy in a circumferential direction.

Figure 5:
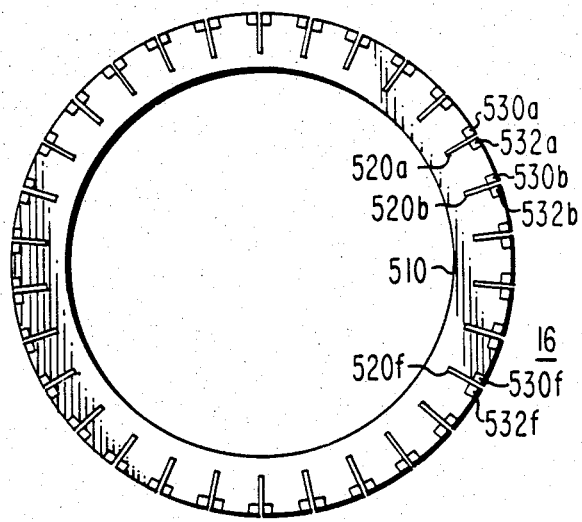
FIG. 5 illustrates a heat sink ring which is associated with the printed circuit of FIG. 4.

It has been discovered that chip resistors mounted across slots of printed circuit board 18 tended to be destroyed under high power conditions. The thickness of the metal plating is approximately 0.0005 inch (0.013 mm). The poor performance appears to be due at least in part to poor thermal contact between the chip resistor and the copper plating of pattern 410 which allows the temperature of the resistor to rise to a destructive level. This problem is solved by the use of thick film resistors fired at high temperature directly onto the heat sink, thereby providing excellent thermal bonding to the heat sink. The firing temperature of approximately 800° C. is so high it would destroy the dielectric material of printed circuit 18. This problem is solved as illustrated in FIG. 5 by firing thick film resistors 530 and 532 on each side of slots 520 of a copper heat sinking ring 16. Slots 520 are slightly wider and slightly longer then the nominal size of slots 420, so that the effective size and position of each slot for purpose achieving circular symmetry is controlled by the printed circuit rather than by the ring as is made more clear by FIG. 6. The firing of resistors 530 and 532 onto ring 16 is performed in an inert atmosphere such as Nitrogen to prevent oxidation of the copper ring. It has been found that the copper ring tends to deform slightly at firing temperatures, and becomes very soft after firing due to annealing, so the ring may advantageously by fired and handled in a ring-shaped machined depression in a stainless-steel carrier and held in place in the carrier by a stainless steel ring pressed against those portions of ring 18 not covered by resistor inks.

After resistors 530 and 532 are fired onto the surface of ring 16, a bonding pad (visible in FIG. 5 as a small white area in the center of each resistor) is deposited onto each resistor to provide an ohmic contact point. During the amplifier assembly process, copper ring 16 is registered with pattern 410 as described below and soft-soldered thereto at a temperature which does not damage the dielectric material of printed circuit board 18.

Figure 6:
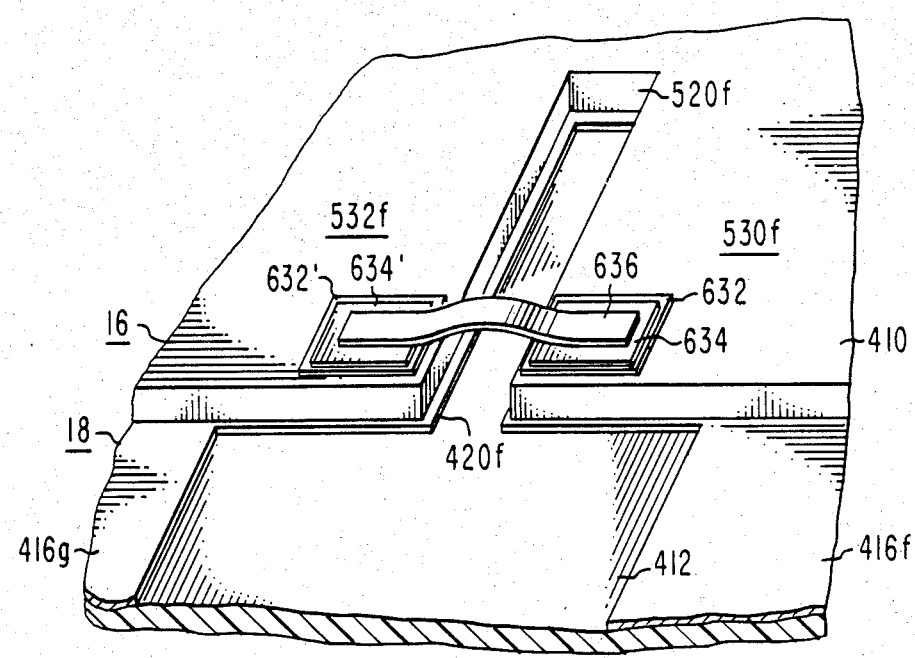
FIG. 6 is a view of a portion of the ring of FIG. 5 mounted on the printed circuit board of FIG. 4, showing details of isolation resistors and a bonding strap mounted on the ring.

FIG. 6 is a view of a portion of copper ring 16 and the associated portion of printed circuit board 18 near one of the choke slots after assembly. Dielectric material 412 of printed circuit board 18 is visible in the foreground, with a portion of wide conductor 416f on the right and a portion of wide conductor 416g on the left. Printed slot 420f lies between wide conductor 416f and 416g. Slot 520f of copper ring 16 is registered with slot 420f. Because slot 520f is slightly larger than slot 420f, a small portion of the plating of printed circuit board 18 near slot 420 is not covered by copper ring 16. Consequently, small variations in slots 520 due to unavoidable machining tolerances do not affect the precision of the resulting slot, which is defined by the printed pattern of board 18. Resistor assembly 530 f includes fired thick-film resistor 632 and bonding pad 634, while resistor assembly 532f includes resistance material 632' and bonding pad 634'. A bonding strap 636 bridges bonding pads 634 and 634'. This arrangement provides extremely good heat sinking for resistor 530f and resistor 532f. Since there are two resistor assemblies of equal size formed at the same time from the same material, their resistances are equal and the power is divided equally between the two portion of the series connected resistors. Thus the heat generated due to circulatory operating modes is divided equally and sunk to the copper ring on opposite sides of each slot. The structure also provides a circuit point isolated from ground by the parallel combination of the two printed resistors, so that checking for short-circuits may be accomplished with a simple ohmmeter, even after the bridging strap is connected.

FIG. 7 illustrates in cross-sectional view details of amplifier 1. In FIG. 7, a coaxial transmission line 708 including a dielectric material 710 and center conductor 712 passing through an aperture 60 is visible, as well as the connections of the ends of center conductor 712 to structures above and below central member 10.

Also visible in FIG. 7 is one of the filters 72 by which direct (DC) bias voltage is applied to the amplifier modules. As known, the bias filter prevents the leakage of microwave energy from the amplifier to the power supply. Filter 720 includes a dielectric material 722 and a conductor 724. The high dielectric constant of material 722 forms a shunt capacitor which attenuates high frequency signals which may attempt to flow through the filter. More complex filters may also be used, such as those which include magnetic materials.

The application of bias voltage to the amplifier modules causes power dissipation. The power dissipation tends to be large for amplifier modules used for amplifying frequencies of several GHz and higher frequencies because of the relatively low DC-to-signal conversion efficiency. The high power dissipation tends to raise the temperature of the amplifier modules, which tends to cause degradation and failure.

Figure 8:
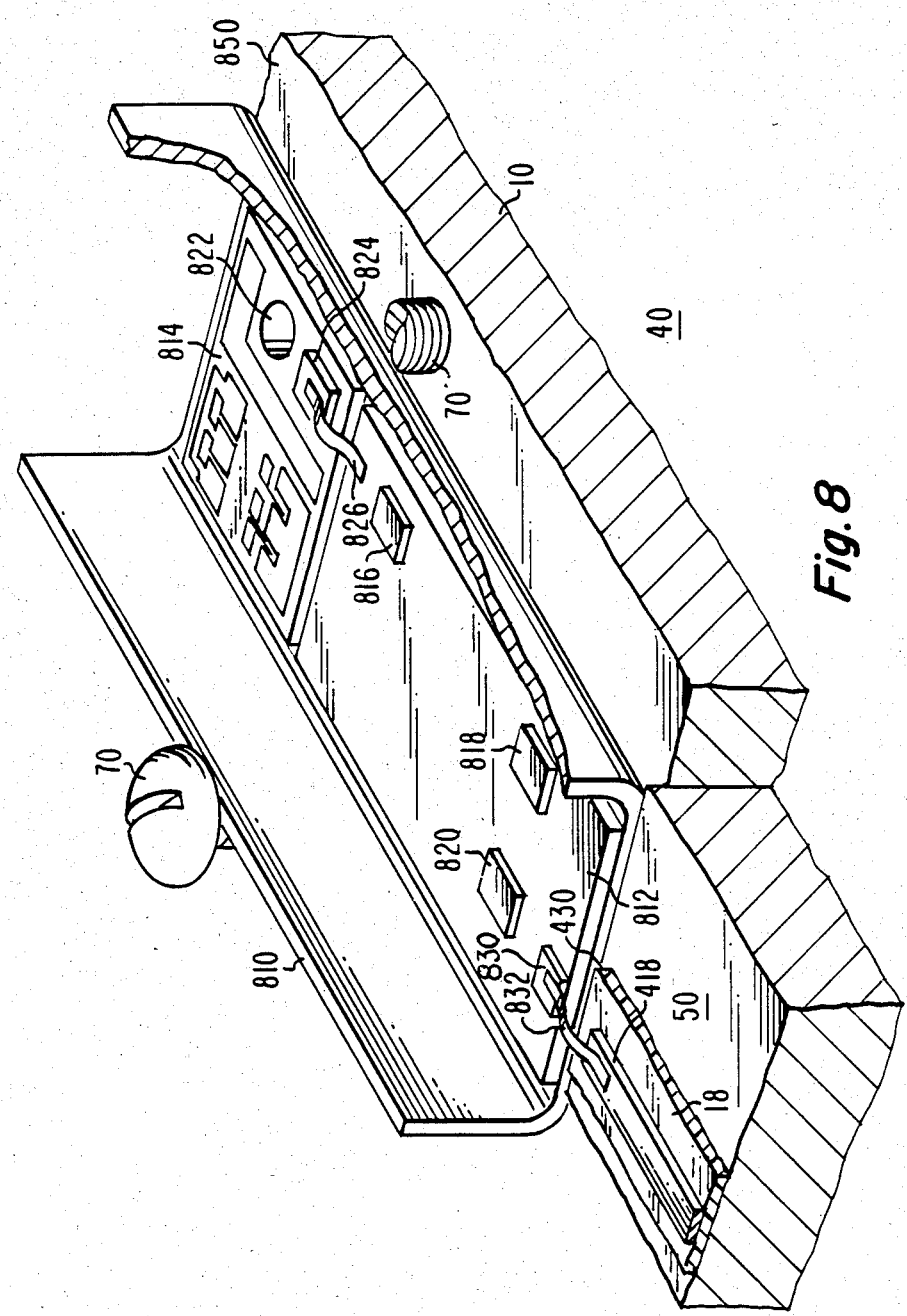
FIG. 8 is a simplified isometric view of a section of the amplifier of FIGS. 1 and 3 illustrating details of an amplifier module and its relationship to other portions of the amplifier.

One amplifier module 40 out of the 30 such modules arrayed about the periphery of printed circuit board 18 is illustrated in greater detail in FIG. 8. Amplifier module 40 includes a U-shaped channel or carrier 810, a portion which is cut away to reveal an insulating MIC (microwave integrated circuit) Beryllium Oxide substrate 812 bonded to the bottom of channel 810 and a further printed circuit board 814 formed from the aforementioned Duroid material. Substrate 812 is loaded with the active amplifying elements. As illustrated, three active elements 816, 818, 820 are used. The Beryllium Oxide provides a low thermal resistance path between active elements 816-820 and the bottom of channel 810, from which the heat produced by the active devices is carried away by central member 10 (not illustrated in FIG. 8) against which channel 810 is pressed by screws 70 and 70'. Printed circuit board 814 includes an aperture 822 positioned over hole 60 formed in central member 10. Aperture 822 when so arranged can receive the center conductor 712 of a coaxial transmission line 708. A bonding pad 824 is arranged adjacent aperture 822 for receiving the center conductor. A bonding jumper 826 connects bonding pad 824 to the input structure (not illustrated) of substrate 812. The signal is amplified by circuits (not specifically illustrated but well known in the art) printed on and bonded to substrate 812, and the signal so amplified is made available at an output bonding pad 830 and connected by means of a bonding wire 832 to a microstrip terminal 430, which is the end of a printed conductor 418 on printed circuit board 18.

The thickness of substrate 812 equals the thickness of printed circuit board 814 and also equals the thickness of printed circuit board 18. Consequently, in order for the upper surface of substrate 812 to be at the same level as the upper surface of printed circuit board 18 for least signal attenuation at the transition between board and substrate, carrier 810 is mounted in a slight depression in upper surface 50 of central member 10. Upper surface 50 is raised above surface 850 as illustrated in the sectional view of FIG. 8 by the thickness of the walls of carrier 810. Thus, the inside bottom of carrier 810 is at the same level as upper surface 50 of central member 10, and may be considered an extension thereof.

The amplifier modules so arranged can be accessed for test by simply removing amplifier top cover 12. Any module may be removed for replacement by removing the connections to bonding pads 824 and 830 and removal of two screws 70.

Figure 9:
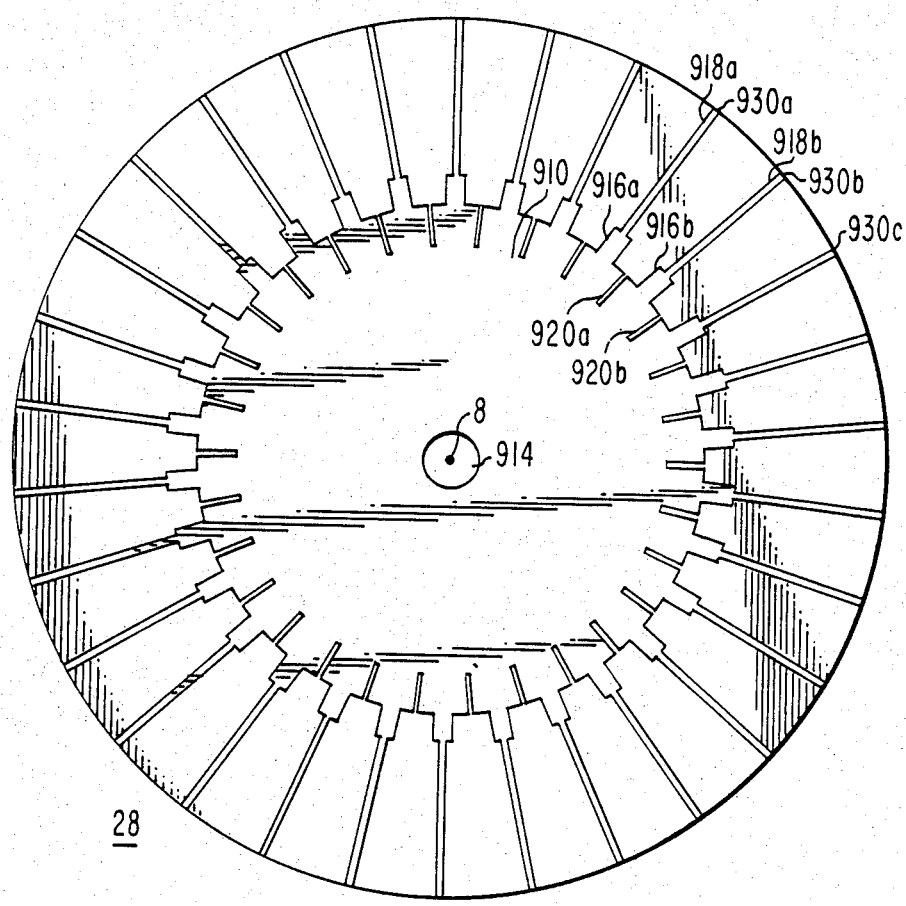
FIG. 9 illustrates the pattern of another printed circuit board which is a portion of the arrangement of FIGS. 1 and 3.

FIG. 9 illustrates details of printed circuit board 28. Printed circuit board 28 has a larger diameter than printed circuit board 18, as best seen in FIG. 7. The conductor pattern 910 of printed board circuit 28 is identical to that of printed circuit board 18, except that narrow conductive fingers 918 are longer than conductive fingers 418. The end of each conductive finger 918 forms a microstrip terminal 930 when printed circuit board 28 is mounted on surface 52. Copper ring 26 is identical to copper ring 16 illustrated in FIG. 5, and the slots 520 therein are registered with the slots 902 of conductive pattern 910 and the ring (and its associated resistors) is soldered thereto as described in conjunction with FIGS. 4 and 5.

When assembled, the arrangement described in conjunction with FIGS. 1 through 9 forms an amplifier in which coaxial input port 4 is defined by pin 29 and aperture 64, and output port 6 is defined by pin 19 and aperture 54. Signal propagating into input port 4 encounters a radial transmission line in which lower surface 52 of central member 10 is one conductor and the other conductor is the central portion of conductor pattern 910 of printed circuit board 28. This is illustrated schematically as 1010 in FIG. 10. The steps of pin 29 are selected to provide an impedance transformation between 50 ohms and the input end of the radial transmission line 1010. The input power spreads symmetrically through the radial transmission line, and divides equally into 30 portions.

Any unbalance in the signal arriving at the end of the radial transmission line causes a signal imbalance which causes a current flow in resistors 530 and 532, which dissipates signal power and which tends to restore signal balance. The balanced signals propagate through the microstrip lines formed by conductive fingers 916 and 918 co-acting with lower surface 52 of central member 10. That portion of the input signal arriving at a microstrip terminal 930 at the end of a conductive finger 916 is coupled to the center conductor of a coaxial section 708 such as that illustrated in FIG. 7. The step in width of conductive segments 916 and 918 provides a further impedance transformation between the radial transmission line 1010 and the end of miniature coaxial cable 708. Each coaxial transmission line 708 propagates a signal parallel with axis 8 to upper surface 50 of central member 10 (actually to the upper surface of 810, which is continuous with upper surface 50 as described above). Each portion of the signal is amplified by an amplifier module 40 and the amplified signal portion is coupled to a microstrip terminal 430 at the end of a conductive portion 418 of printed board 18 co-acting with top surface 50 of central member 10. The signal propagates along a second microstrip transmission line including conductive member 418 and a wider conductive member 416 coacting with top surface 50, which together provide impedance transformation to a second radial transmission line or waveguide 1030 formed by the conductor pattern 410 of printed board 18 coacting with upper surface 50. The signals from all of the amplifier modules converge towards and are summed at output port 6. Asymmetry caused by degradation or failure of one amplifier module is reduced by dissipation in resistors 530.

As described, the power loss between the output terminal of each amplifier module and common output port 6 is minimized by comparison with a structure in which there are transmission line connectors or right-angle bends in the transmission lines leading from the output port of each amplifier module to the power combining point at output port 6. Connectors such as types BNC,N and others cause additional insertion loss. Simple bends have also been found to result in unavoidable power loss. The transitions between each coaxial transmission line 708 and microstrip terminals 430 at the bottom and each bonding pad 824 at the top include right angle bends and therefore include loss. By having these bends on the input side of each amplifier module, additional bias need not be provided to the amplifier modules to produce amplified signal which is then dissipated in bends. Thus, the amplified power from each amplifier module is utilized to the maximum and the power dissipation of the amplifier as a whole is minimized. The effect of the signal losses due to the bends at the top and bottom of each coaxial line 71 is to slightly degrade the gain of the power amplifier. This may be overcome by use of preamplification.

FIGS. 11–15 are plots of performance of 30-way power splitters and dividers as illustrated in FIGS. 1–3 and 7. The dimensions of various parts of the structure are as follows:

| | | |
|---|---|---|
| Overall Radius R (FIG. 3b) | | 6.0 cm |
| Height across covers 12 and 22 | | 1.4 cm |
| Thickness of printed boards 18 and 28 | 010 in | 0.25 mm |
| Radius of printed board 18 | | 3.8 cm |
| Radius of printed board 28 | | 4.3 cm |
| Length of slots 420 | | 0.46 cm |
| Inner diameter of ring 16 | | 1.75 cm |
| Outer diameter of ring 16 | | 2.76 cm |
| Length of slots 520 | | 0.46 cm |
| Thickness of ring 16 | 0.005 in | 0.127 mm |

Figure 11:
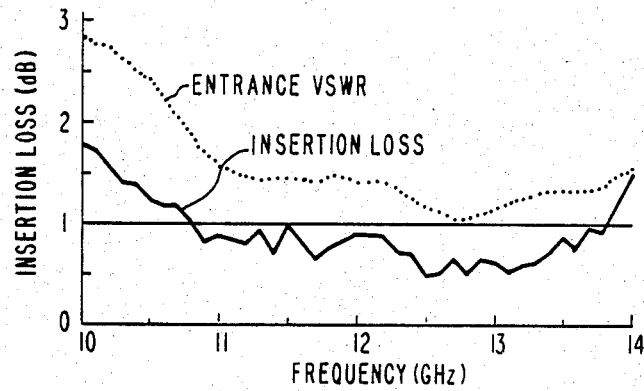
FIG. 11 is a plot of VSWR looking into the amplifier output port and of the insertion loss of the output combiner over a frequency range of 10 to 14 GHz.

FIG. 11 illustrates the VSWR at common input port 4, and the insertion loss from the common input port to one of the microstrip terminals 930 of a radial power divider such as that illustrated in FIG. 2 over a frequency range extending from 10 to 14 GHz. The VSWR was measured with each of the microstrip terminals associated with printed circuit board 28 terminated in a resistor matching the characteristic impedance of the microstrip transmission line. The insertion loss plot was generated by measuring the power received at each microwave terminal associated with circuit board 28 with the remainder of the microstrip terminals terminated in approximately their characteristic impedance. A calculation was then made for each frequency, adding together the power received at each of the microstrip terminals and comparing the sum so calculated to the input power. The difference is the insertion loss illustrated in FIG. 11. This insertion loss includes a component due to reflection and a component due to dissipation (I²R) losses.

Figure 12:
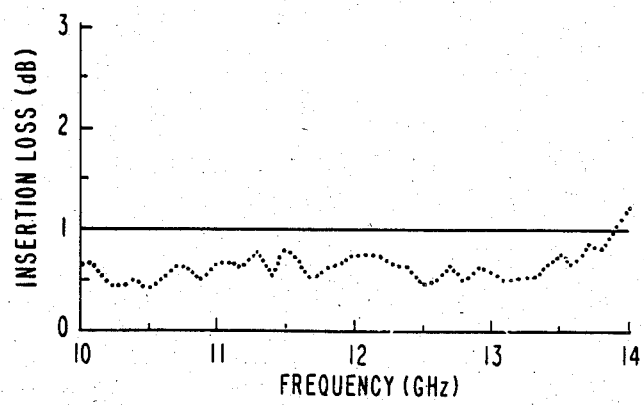
FIG. 12 is a plot of the heating or $I^2R$ component of the insertion loss of FIG. 11.

FIG. 12 plots insertion loss versus frequency but with the effect of reflection loss due to the entrance VSWR eliminated. Thus, the plot of FIG. 12 is essentially the dissipation losses of the power divider of FIG. 2.

Figure 13:
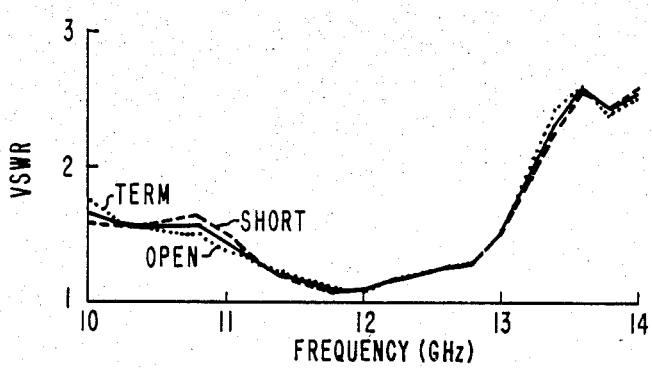
FIG. 13 plots as a function of frequency the VSWR looking into a microstrip port of the power combiner portion of the power amplifier for various terminations of an adjacent microstrip terminal.

FIG. 13 is a plot of the VSWR looking into one microstrip terminal 422 with the common output port of the amplifier terminated and with the remaining 29 microstrip terminals 422 terminated. Also included are plots for the case where an adjacent microstrip terminal 422 is open-circuited and short-circuited. It can be seen that the VSWR is not materially affected by shorting or opening an adjacent microstrip port over the frequency range of 10 to 14 GHz.

Figure 14:
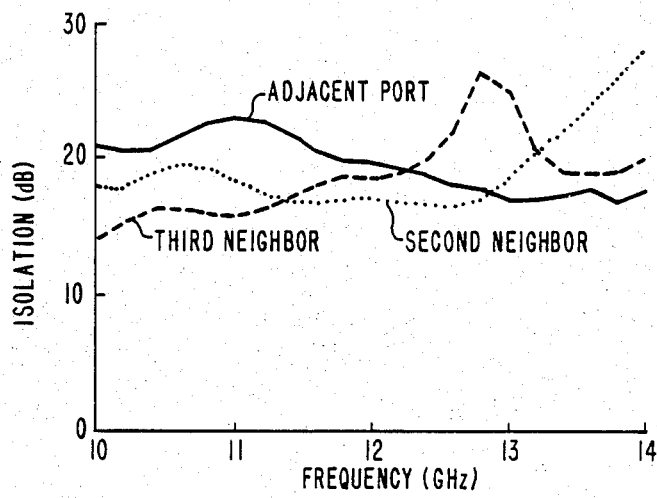
FIG. 14 plots as a function of frequency the isolation from one microstrip terminal of the power combiner to adjacent ports.

FIG. 14 illustrates the isolation or attenuation between a microstrip terminal 422 and adjacent, semi-adjacent or third neighboring microstrip ports with the remainder of the microstrip ports and the common output port terminated.

Figure 15:
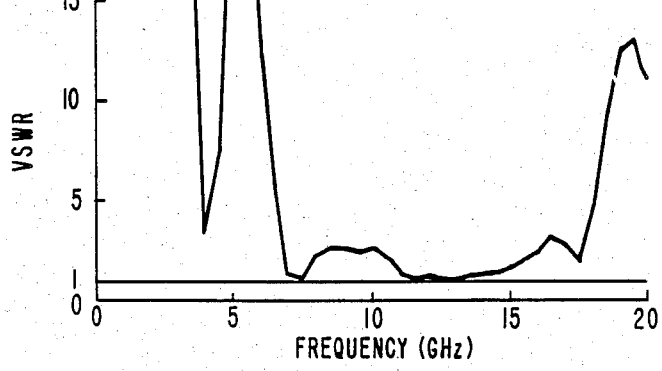
FIG. 15 plots as a function of frequency the VSWR looking into the common output port of the power combiner.

FIG. 15 illustrates the entrance VSWR of a power combiner or splitter as in FIGS. 1 and 2, respectively, over a broad frequency range. The high VSWR below 7 GHz and above 17 GHz is attributed to the impedance transformers.

Other embodiments of the invention will be obvious to those skilled in the art. For example, a carrier for each amplifier module such as carrier 810 of FIG. 8 is not necessary but is merely convenient. Upper surface 50 of central disc-like member 10 may continue from the radial transmission line and under the amplifier modules without a step in level, if desired. The input and output transmission lines may include tapered rather than stepped impedance transformation, or may include no transformation at all. More or less amplifier modules than 30 may be used, and auxiliary cooling methods such as water cooling or convection cooling may also be used. If convenient, one bias voltage feed through a filter such as 720 may serve a plurality of amplifier modules. Printed circuit board 28 may have the same diameter as board 18, and a second set of amplifier modules may be coupled to bottom surface 52 of central member 10, arranged with their inputs coupled to receive divided signal from microstrip terminals 930 and their outputs driving coaxial transmission lines 708, thereby effectively cascading each amplifier module 40 on the top surface of central number 10 with a further amplifier module on the bottom surface.

What is claimed is:

1. A radial electromagnetic power splitter/combiner for operation at frequencies near a design center frequency, comprising:

a disc-like conductive plate;

a coaxial common port including a center conductor terminating in contact with the center of said disc-like conductive plate and also including an outer conductor;

a flat disc-like dielectric plate having a diameter and first and second flat sides and including a central aperture, said flat dielectric plate having said first side supported by said disc-like conductive plate in a position with said central aperture of said dielectric plate surrounding said center conductor;

a second conductive plate contiguous with said second flat side of said dielectric plate and having a generally disc-like configuration including an outer edge and a central aperture, said central aperture of said second conductive plate being coupled to said outer conductor of said common port, said outer edge having formed therein a first plurality of elongated slots at equally spaced locations, said slots projecting radially towards said common port by a distance approximately equal to one quarter wavelength at said design center frequency, and also having a second plurality equal to said first plurality of equally spaced conductive extensions located equidistant from said radial slots, each of said conductive extensions projecting from said outer edge in a direction radially away from said common port to form a like plurality of microstrip ports at which the signal power is less than the signal power at said common port in proportion established by said second plurality;

a thermally and electrically conductive ring having an outer diameter substantially equal to the outer diameter of said second conductive plate, said ring having a plurality equal to said second plurality of radial slots projecting radially inward from said outer diameter at equally spaced locations around the periphery of said ring thereby defining first and second sides, and open and shorted ends of each radial slot, said ring being mounted on said second conductive plate with said radial slots in said ring registered with said elongated slots in said second conductive plate; and a plurality equal to said second plurality of resistance means mounted on said conductive ring, each of said resistance means being coupled across one of said second plurality of radial slots in said conductive ring.

2. A splitter/combiner according to claim 1, wherein:

each of said resistance means comprises first and second resistors, each of said first resistors being mounted on said first side of one of said radial slots, and each of said second resistors being mounted on said second side of one of said radial slots; and each said resistance means further comprises conductive bonding means electrically interconnecting said first and second resistors.

3. A splitter/combiner according to claim 1, wherein said second conductive plate is formed from a plating bonded to said dielectric plate.

4. A splitter/combiner according to claim 3 wherein said dielectric plate comprises a low temperature dielectric material.

5. A splitter/combiner according to claim 4 wherein each said resistive means comprises first and second resistors.

6. A splitter/combiner according to claim 5 wherein said first resistor is bonded to said first side of one of said radial slots in said ring and said second resistor is bonded to said second side of said one of said slots in said ring.

7. A splitter/combiner according to claim 6 wherein each of said resistors comprise thick film resistance means fired onto said ring.

8. A splitter/combiner according to claim 7 wherein said first and second resistors further comprise conductive first and second bonding pads, respectively, deposited on said thick film resistance means.

9. A splitter/combiner according to claim 8 further comprising conductive means bridging from said first bonding pad to said second bonding pad.

10. A method of fabricating a radial electromagnetic splitter/combiner, comprising the steps of:

fabricating a disc-like conductive plate;

fastening a center conductor of a coaxial common port to the center of one side of said disc-like conductive plate;

fabricating a disc-like printed circuit board having first and second sides and a central aperture and plated on said first side with a conductor extending from said central aperture to an outer edge, and including a plurality of radial slots projecting towards said central aperture from said outer edge and also including conductive extensions projecting radially away from said outer edge;

mounting said second side of said printed circuit board on said one side of said disc-like conductive plate with said central aperture surrounding said center conductor;

fabricating an electrically and thermally conductive flat ring having a periphery defining an outer diameter substantially equal to said diameter of said outer edge of said conductor of said disc-like printed circuit board and having a second plurality equal to said first plurality of radial slots projecting from said periphery radially towards the center of said ring;

firing thick-film resistance means onto a flat surface of said ring at points adjacent to said slots;

placing bonding means on said thick-film resistance means in such a fashion as to connect each of them across the open end of one of said slots in said flat ring; and thermally and electrically bonding said flat ring to said first side of said printed circuit board with said slots in said flat ring in registry with said slots in said printed circuit board.

11. A method according to claim 10 wherein said firing step further comprises the steps of:

firing first thick film resistance means onto a flat side of said ring adjacent a first side of each said slot in said ring; and firing second thick film resistance means onto said flat side of said ring adjacent a second side of each said slot in said ring.

12. A method according to claim 11 wherein said step of placing bonding means comprises connecting bonding means between those sides of said first and second thick film resistance means remote from said ring.

13. An amplifier, comprising:
a conductive central disc-like member including a central axis and also including first and second flat sides which are parallel to a plane orthogonal to said central axis;
an input port adapted for receiving signal to be amplified and for coupling said signal to be amplified to a point near the junction of said central axis and said first flat side of said central disc-like member;
power splitting means coupled to said input port and including a flat conductive member spaced from said first flat side of said central disc-like member to form a first radial waveguide for conveying said signal to be amplified from said input port to points at a first radius therefrom, and also including radial-waveguide-to microstrip transition means for splitting said signal to be amplified into a first plurality of portions, each of said portions appearing on one of a first plurality of microstrip terminals equally spaced along a circle spaced by a second radius from said central axis;
a second plurality of microstrip terminals spaced by a predetermined distance from said second side of said central disc-like member;
an output port;
power combining means coupled to said output port and including a flat conductive portion of a printed circuit board spaced from said second flat side of said central disc-like by a dielectric portion of said printed circuit board to form a second radial waveguide, and also including microstrip to radial waveguide transition means coupled to said second plurality of microstrip terminals and to said second radial waveguide for coupling to said output port combined signal from said second plurality of microstrip terminals, said microstrip to radial waveguide transition means including a plurality equal to said second plurality of radial slots formed in the edge of said second radial waveguide;
a third plurality of amplifiers, said third plurality being equal to each of said first and second pluralities, each of said amplifiers including an input terminal coupled to one of said first plurality of microstrip terminals and an output terminal coupled one of said second plurality of microstrip terminals, each of said amplifiers also being biased to amplify the signals received from said one of said first microstrip terminals to produce an amplified signal at said one of said second plurality of microstrip terminals;
a metal ring having an outer diameter less than the outer diameter of said second radial waveguide and including a plurality equal to said second plurality of radial slots each of which is larger than the corresponding radial slot in said radial waveguide, said metal ring being electrically and thermally bonded to said flat conductive portion of said printed circuit board with said slots of said metal ring being registered with said slots in said radial waveguide; and
resistance means bonded to said metal ring and electrically coupled across said slots in said metal ring.

14. An amplifier according to claim 13, wherein said resistance means comprises a plurality of pairs of resistors each pair of which is associated with one of said radial slots in said metal ring, a first resistor of each pair of resistors being bonded to one side of each said radial slot in said metal ring and a second resistor of each pair of resistors being bonded to another side of each said radial slot in said metal ring.

15. An amplifier according to claim 14 further comprising a bonding strap coupling said first resistor of each said pair in series with said second resistor of said pair.

* * * * *